US012356757B2

(12) United States Patent
Temple

(10) Patent No.: US 12,356,757 B2
(45) Date of Patent: Jul. 8, 2025

(54) COMPOUND PARABOLIC RADIANT CONCENTRATOR

(71) Applicant: Will John Temple, Placerville, CA (US)

(72) Inventor: Will John Temple, Placerville, CA (US)

(*) Notice: Subject to any disclaimer, the term of this patent is extended or adjusted under 35 U.S.C. 154(b) by 1022 days.

(21) Appl. No.: 17/241,862

(22) Filed: Apr. 27, 2021

(65) Prior Publication Data

US 2021/0265518 A1    Aug. 26, 2021

Related U.S. Application Data

(63) Continuation-in-part of application No. 16/726,742, filed on Dec. 24, 2019, now abandoned, and a continuation-in-part of application No. 16/554,322, filed on Aug. 28, 2019, now Pat. No. 11,846,454.

(60) Provisional application No. 63/036,408, filed on Jun. 8, 2020.

(51) Int. Cl.
| | |
|---|---|
| *H10F 77/42* | (2025.01) |
| *F24S 23/70* | (2018.01) |
| *H02S 20/32* | (2014.01) |
| *H02S 40/22* | (2014.01) |
| *H10F 10/14* | (2025.01) |

(52) U.S. Cl.
CPC ............ *H10F 77/488* (2025.01); *F24S 23/70* (2018.05); *H02S 20/32* (2014.12); *H02S 40/22* (2014.12); *H10F 10/148* (2025.01)

(58) Field of Classification Search
CPC .............. H01L 31/0547; H01L 31/0684; H01L 31/0543; F24S 23/70; F24S 23/74; H02S 20/32; H02S 40/22; Y02E 10/40; Y02E 10/52; Y02E 10/547
See application file for complete search history.

(56) References Cited

U.S. PATENT DOCUMENTS

| | | | | |
|---|---|---|---|---|
| 4,045,246 | A * | 8/1977 | Mlavsky | H01L 31/0543 136/246 |
| 4,289,119 | A * | 9/1981 | Meyer, Sr. | F24S 23/30 126/674 |
| 5,352,886 | A | 10/1994 | Kane | |
| 2003/0037814 | A1 * | 2/2003 | Cohen | F24S 23/80 136/246 |
| 2003/0086743 | A1 * | 5/2003 | Gruenbacher | A61Q 19/00 401/133 |

(Continued)

OTHER PUBLICATIONS

Stephen G. Warren "Optical constants of carbon dioxide ice" Applied Optics / vol. 25, No. 16 / Aug. 15, 1986 (Year: 1986).*

(Continued)

*Primary Examiner* — Michael Y Sun

(57) ABSTRACT

The present invention relates to a device (1) for the use of concentrating radiant energy onto a receiver (2). The device comprises a first concentrator (5) that is filled with a transmissible material for the use of increasing the acceptance angle of the concentrator and concentrating the radiant energy onto a bifacial receiver (2). Embodiments also comprise a second concentrator (4) that directs the concentrated radiant energy to both sides of the bifacial receiver, whereby the second concentrator enables the device to use a substantially smaller receiver. In some embodiments, the receivers comprise photovoltaic (PV) cells.

14 Claims, 5 Drawing Sheets

(56) References Cited

U.S. PATENT DOCUMENTS

2015/0280641 A1* 10/2015 Garg .................. H01L 31/0475
                                                        136/244
2021/0290430 A1*  9/2021 Kim ....................... B05B 9/005

OTHER PUBLICATIONS

John A. Duffie & William A. Beckman, Solar Engineering of Thermal Processes, 2006, p. 340-341, Wiley, USA.
Soteris A. Kalogirou et al., https://www.sciencedirect.com/topics/engineering/compound-parabolic-collector, 2014-2021.

* cited by examiner

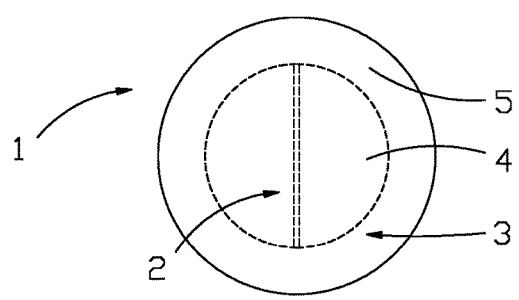
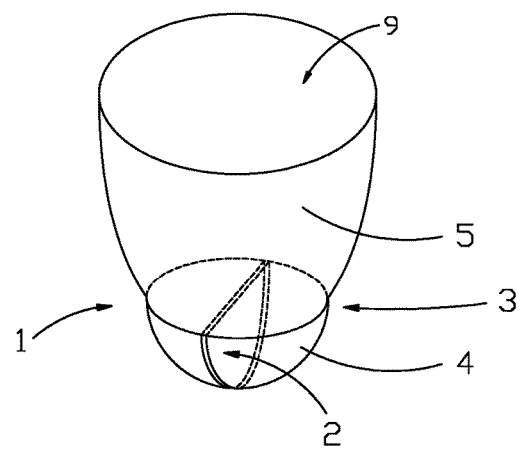
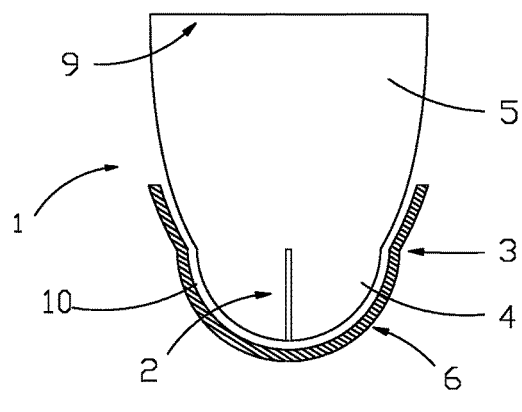
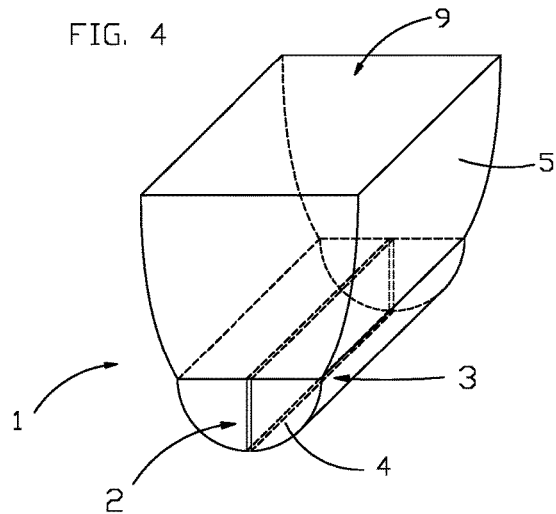

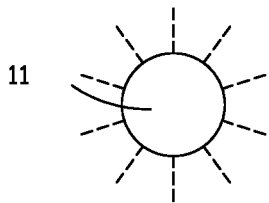 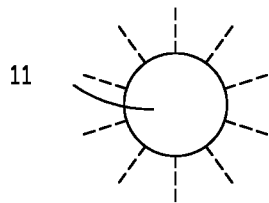
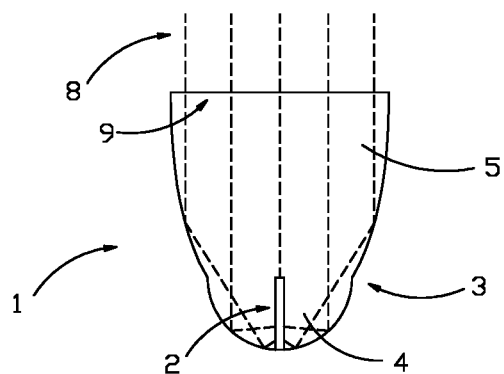 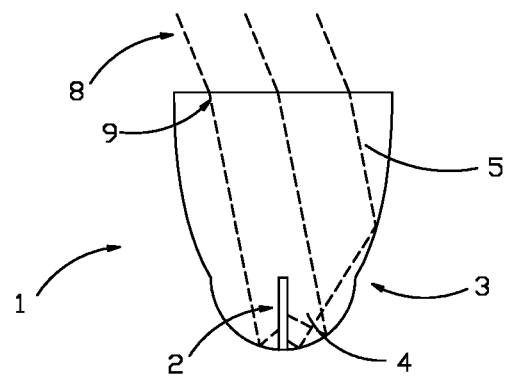
FIG. 5          FIG. 6
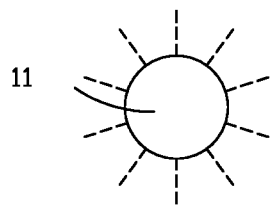 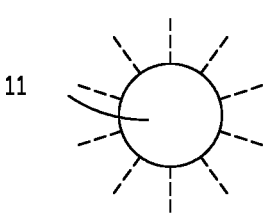
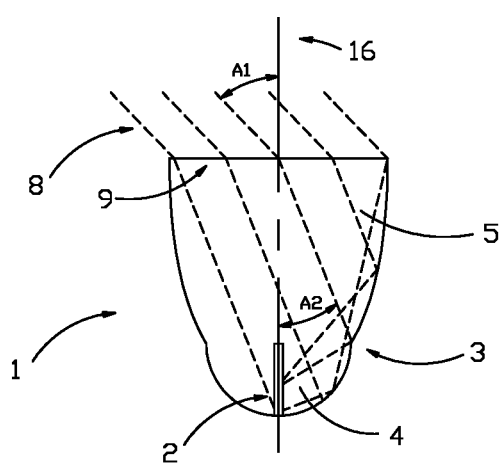 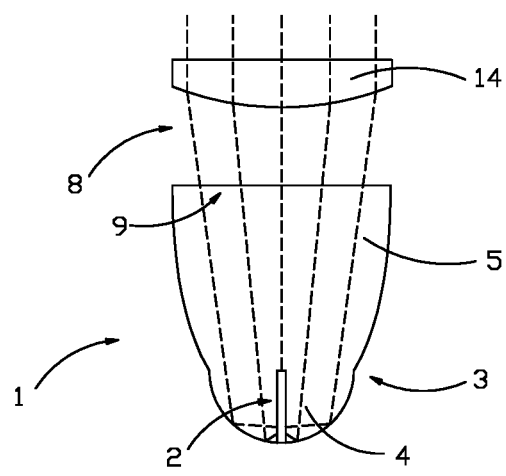
FIG. 7          FIG. 20

FIG. 13
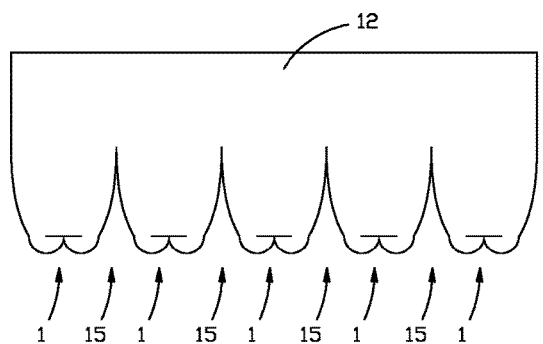
FIG. 14
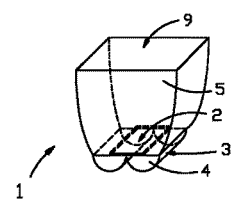
FIG. 15
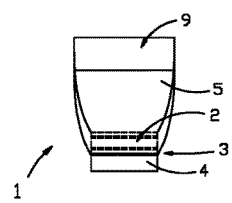
FIG. 12
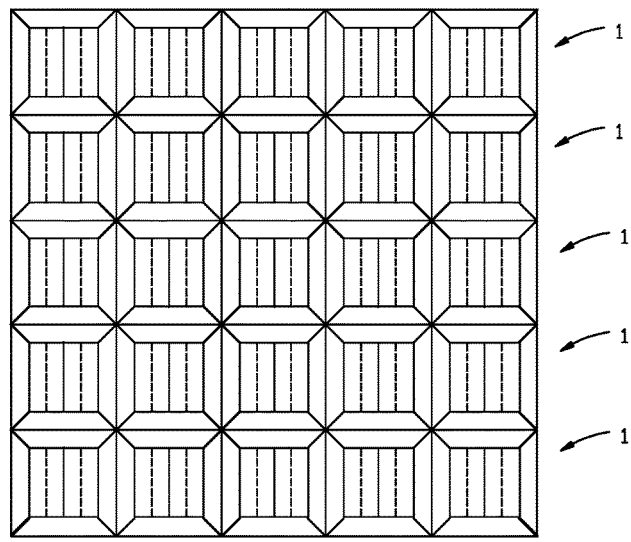
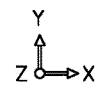

FIG. 16
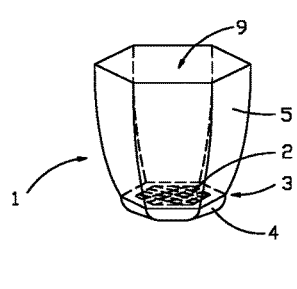
FIG. 18
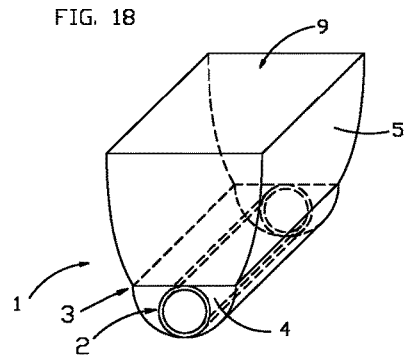
FIG. 19
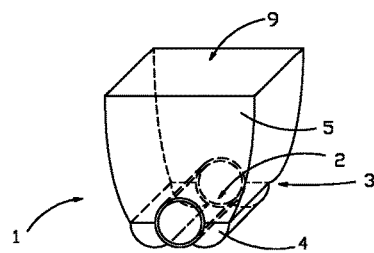
FIG. 17
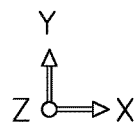
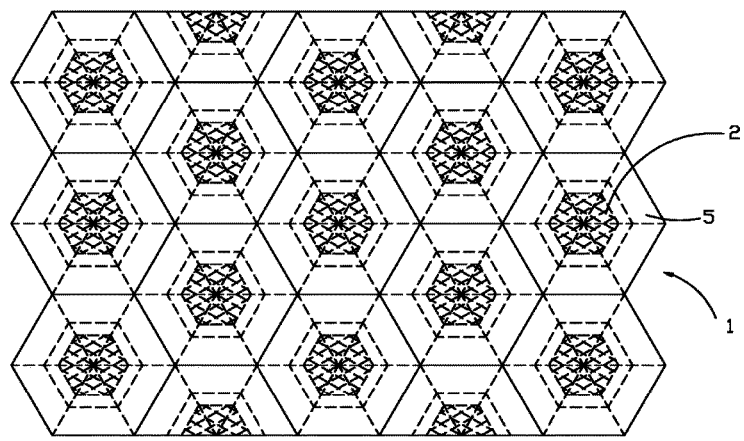

COMPOUND PARABOLIC RADIANT CONCENTRATOR

CROSS-REFERENCE TO RELATED APPLICATIONS

This application claims the benefit of RPA Ser. No. 16/726,742 filed 2019 Dec. 24 and RPA Ser. No. 16/554,322 filed 2019 Aug. 28 by the present inventor, and PPA Ser. No. 63/036,408 filed 2020 Jun. 8 by the present inventor, which are incorporated by reference

BACKGROUND

Field of Invention

The disclosed embodiments relate generally to concentrating radiant energy.

Description of Prior Art

Energy can be transferred through radiant energy, and concentrators can concentrate radiant energy to increase radiant flux. Many existing concentrators are in use to efficiently collect radiant energy from the sun. Concentrators can be used to collect radiant energy for the use of heating, or for the use of turning radiant energy into electricity, such as through photovoltaic (PV) cells.

PV materials/cells can absorb radiant energy from two sides. Two-sided PV cells are generally referred to as "bifacial" cells. Bifacial cells often use radiant energy reflected from a background, such as the ground. Bifacial cells have also been used with reflectors to increase the radiant energy absorbed by the back side, which is a side facing away from the sun.

Generally, the front side of common bifacial cells do not receive radiant energy that has been concentrated from the incoming flux, which comes from the source. Generally, the back sides receive no concentration, or very little concentration of radiant flux from the source. For this disclosure, very little, or low concentration will be defined as a concentration factor less than two.

PV cells also comprise electrical contacts. In common PV cells, the contacts usually shade some of the PV material, which lowers the amount of power that can be generated from a given amount of PV material. Some PV cells have moved the contacts to the back side of the cells, to eliminate this problem. However, this does not eliminate the problem for bifacial cells. What is needed is for the contacts to not shade PV cell material in a bifacial cell.

Solar radiant energy collectors generally come in two types, which are tracking and non-tracking. Tracking apparatus generally adds cost, and if an array of solar collectors is utilized, one collector often shades its neighboring collector, which reduces the benefits of tracking. This effect not only limits the collection, but it limits it when it is usually most needed. Solar collectors generally don't have a problem with collecting solar power at noon under sunny skies. Concentrators that use tracking generally don't collect well from a cloudy sky, and they don't concentrate and collect well during early morning and early evening when one collector shades the next. Concentrating collectors that use tracking also have heat problems, as a high level of concentration heats up the receiver, which reduces efficiency. High concentration systems often require active cooling, which uses energy and adds cost.

Non-tracking collectors are simpler and cheaper, but usually don't provide much of a concentration factor, as the sun is constantly moving. Compound Parabolic Concentrators (CPCs) are an example of a concentrator that can be non-tracking, as they generally have a greater acceptance angle than common lenses and parabolic dishes. A "common CPC" will be defined for this disclosure as a CPC that is filled with a low index of refraction material, such as air or a vacuum. "Low index of refraction" will be defined as less than 1.2. A common CPC does not use refraction, but does use reflection to operate.

A common CPC provides concentration, but only to a limited acceptance angle. Generally, the half-acceptance angle is 45 degrees, or less. This is useful for concentrating solar beam energy, but often gives up collecting a substantial amount of diffuse light from the sky. A common CPC concentrator also only comprises a cross section-comprised of one wall shape, wherein the shape comprises two parabolic sides/walls. The focal points of the parabolas lie on each other's parabolas. A focal point of the parabola defining one of the walls lies on the parabola defining the opposing wall. The receiver lies between the focal points.

What is needed is a non-tracking concentrator that improves the concentration factor compared to existing non-tracking concentrators, and to reduce the receiver size. What is also needed is for a concentrator that can substantially reduce the expensive and/or toxic materials in solar PV panels, which are generally the PV cell materials and the electrical contact materials.

BRIEF DESCRIPTION OF THE DRAWINGS

For a better understanding of the embodiments of the invention, as well as additional embodiments thereof, reference should be made to the Description of Embodiments below, in conjunction with the following drawings, in which like reference numerals refer to corresponding parts throughout the figures.

FIG. 1 illustrates a cross sectional view of a radiant concentrator in accordance with some embodiments.

FIG. 2 illustrates a top view of a radiant concentrator in accordance with some embodiments.

FIG. 3 illustrates a perspective view of a radiant concentrator in accordance with some embodiments.

FIG. 4 illustrates a perspective view of a radiant concentrator in accordance with some embodiments.

FIG. 5 illustrates a cross sectional view of a radiant concentrator in accordance with some embodiments.

FIG. 6 illustrates a cross sectional view of a radiant concentrator in accordance with some embodiments.

FIG. 7 illustrates a cross sectional view of a radiant concentrator in accordance with some embodiments.

FIG. 12 illustrates a bottom view of an array of radiant concentrators in accordance with some embodiments.

FIG. 13 illustrates a cross sectional view of a radiant concentrator in accordance with some embodiments.

FIG. 14 illustrates a perspective view of a radiant concentrator in accordance with some embodiments.

FIG. 15 illustrates a side view of a radiant concentrator in accordance with some embodiments.

FIG. 16 illustrates a radiant concentrator in accordance with some embodiments.

FIG. 17 illustrates top view of an array of radiant concentrators in accordance with some embodiments.

FIG. 18 illustrates a perspective view of a radiant concentrator in accordance with some embodiments.

FIG. 19 illustrates a perspective view of a radiant concentrator in accordance with some embodiments.

FIG. 20 illustrates an assembly of a plurality of radiant concentrators in accordance with some embodiments.

REFERENCE NUMERALS IN DRAWINGS

Figure 8:
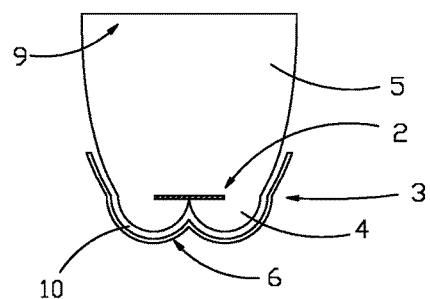
FIG. 8 illustrates a cross sectional view of a radiant concentrator in accordance with some embodiments.

1 Radiant Energy Concentrator
2 Receiver
3 Waist
4 Lower Concentrator
5 Parabolic Sided Upper Concentrator
6 Reflector/Reflective Surface
8 Rays of Radiant Energy
9 Aperture
10 Gap
11 Radiant Source (Sun)
12 Contact
14 Lens
15 Shaded Space
16 Reference line (Axis/Normal to top surface)
A1 Angle 1 (Outer Acceptance Angle)
A2 Angle 2 (Inner Acceptance Angle)

DETAILED DESCRIPTION OF THE EMBODIMENTS

Reference will now be made in detail to embodiments and/or methods, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known and/or common processes, mechanisms, procedures, components, and networks have not been described in detail so as not to unnecessarily obscure aspects of the embodiments.

It will also be understood that, although the terms first, second, etc. may be used herein to describe various elements, these elements should not be limited by these terms. These terms may only be used to distinguish one element from another. For example, a first surface could be termed a second surface, and, similarly, a second surface could be termed a first surface, without departing from the scope of the present invention.

The terminology, used in the description of the invention herein, is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or", as used herein, refers to and encompasses any and all possible combinations of one or more of the associated listed items. It will be further understood that the terms "comprises" and/or "comprising," when used in this specification, specify the presence of stated features, steps, methods, operations, elements, and/or components, but do not preclude the presence or addition of one or more other features, steps, methods, operations, elements, and/or components thereof.

Embodiments of radiant concentrator devices, and associated processes for using such devices are described. In some embodiments, the invention is for the use of concentrating radiant energy.

In an aspect of the invention, materials that are substantially transparent to radiant energy in one or more spectral bands will be referred to by the common terms "lens", or "concentrator". Common lenses are generally for focusing light or imaging. In this disclosure, the lenses are generally for the use of concentrating radiant energy, and are not for the use of imaging. Transparent materials for the use of concentrating radiant energy may also be referred to as concentrators or collectors. For the purposes of defining the invention, transparent materials are any material that are at least 50% transparent for the designed spectral range in which radiant energy is transferred.

In an aspect, the methods and embodiments of the invention concentrate radiant energy and turn it into electricity or heat. Surfaces of materials emit and absorb radiant energy. So, heat energy is transferred between materials, or surfaces of the materials, through radiant energy exchange. Some of the present methods and embodiments are for the use of moving net heat energy. The term "net" heat energy means that more heat energy is being absorbed than is being emitted.

Attention is now directed towards embodiments of the device.

FIG. 1 illustrates a cross-sectional view of a radiant concentrator. The concentrator 1 of the present embodiment comprising a concentrating lens (4 and 5) made of a generally transparent material comprising one or more sections (4, 5). The lens also comprises an aperture 9 through which rays of radiant energy pass into the concentrator. In this figure, the lens comprises a shape that has a flat and planar aperture, shown as a line on the top side of the shape. The lens also comprises curved sides, that in this example and embodiment comprise parabolic curves in an upper parabolic section and concentrator 5. The sides of the lens may also comprise reflective material 6. The use of the lens is to concentrate radiant energy, and the lens is also sometimes referred herein with the term "concentrator". The concentrator concentrates radiant energy onto a receiver 2.

In an aspect, the apertures of the present embodiments may comprise anti-reflective coatings, as is common. In this embodiment, the aperture is the top surface of the transmissible material that comprises the space and volume within the CPC.

In many of the embodiments of the present invention, the rays of radiant energy that enter into the concentrator are refracted as they pass through the aperture. The outside environment from which the rays of radiant energy arrive is assumed to be air, or the vacuum of space, for these examples. But the outside environment could be a transmissible material that has a substantially lower index of refraction than the transmissible material of the present concentrators. Due to Snell's Law, the transmissible material of the lens/concentrator refracts the radiant rays as they pass through the aperture. The angle of the rays, with respect to a line normal from the surface of the aperture (FIG. 7, 16) will decrease as the rays enter into a higher index of refraction material. Thus, the acceptance angle and acceptance half-angles of the rays of radiant energy passing into these concentrators are greater above the aperture than just below. The process of refraction greatly increases the acceptance angle and acceptance half-angle of the concentrator.

For example, a common 3D CPC whose center is filled with air may have an acceptance half-angle of 45 degrees. For this design, only rays from half of the possible angles will make it to the receiver 2 at the bottom. If this design is filled with a transmissible material with an appropriate index of refraction, then rays from the all the possible angles may make it to the receiver. A maximum acceptance angle for many of the present embodiments is 180 degrees or Pi radians (minus a differential of angle, as a ray or vector parallel to a flat surface would never cross it). The acceptance angle to maximum acceptance angle ratio for the present embodiments can be greater than the receiver to aperture area ratio (which is 1/concentration ratio), due the CPC being filled with a transmissible material.

In the embodiments presented herein, a cross-sectional shape of the lens comprises a plurality of shapes. The upper part of the concentrator generally comprises a compound parabolic concentrator 5 with substantially parabolic-shaped sides. The focal points of these parabolas lie on the opposing parabola that comprises the other outside edge of the CPC. This embodiment also comprises a second shape. This section of the lens will be referred to as the "lower concentrator" 4. In this embodiment, the cross-sectional shape of the lower concentrator is a half-circle in at least one direction and plane. The shape of the lower concentrator 4 starts and ends at the focal points of the parabolas that comprise the upper concentrator 5, and the shape is below these parabolic focal points. In this embodiment, the center point of the half-circle/arc is at the midpoint of a line drawn between the two parabolic focal points. This line generally denotes the "waist" 3 where the two cross-sectional shapes meet.

The bottom of the lens is in contact with a receiver 2, which bisects the lower concentrator. The receiver can also be referred to as an absorber, as its purpose is to absorb radiant energy. It is beneficial for the receiver to have a surface comprising a highly absorbent material. In an aspect of the invention, the surface of the receiver may be comprised of the same material as the receiver and/or the material 4 below the surface. Or the receiver may have an absorptive surface of a different material or materials. In this example, the receiver is flat and is shown with straight lines, although it is not necessarily limited to being straight/planer, though it can be for some embodiments. It is preferable that there is no gap between the lens and the receiver 2. The receiver and the lens are in contact, or at least close enough to each other that a significant amount of radiant energy is not reflected and does not strike the receiver. In an aspect, the aperture is also not limited to being flat/planer.

FIG. 1 illustrates a reflector 6 that is reflective on the inside surface. The inside surface is the surface that faces the transmissible material. This figure also illustrates a gap 10 between the reflector and the transmissible material that comprises the lens, which comprises the upper and lower concentrator sections. This is preferable, as rays of radiant energy that strike the outside edge of the transparent/transmissible material of the concentrator from the inside will reflect with total internal reflection-provided they strike the edge within the critical angle. Total internal reflection avoids a loss of energy in the reflection. If a ray of radiant energy strikes the edge above the critical angle, the ray of radiant energy will exit the transmissible material, cross the gap and be reflected by the reflective material. The ray will then reenter the transmissible material. However, a gap is not a required element and the outside surface of the transmissible material may comprise reflective material, such as a coating.

The edge of the cross-sectional shape of the lens comprises reflective material that is for the use of internal reflection in embodiments. In an aspect, the steep sides of the parabolic upper section may not allow any rays entering the lens through the aperture to be above the critical angle, thus internally reflecting off of the steep sides. Thus, the reflective material does not need to extend all the way to the aperture, as angles great enough to pass from the inside of the transparent lens material to the outside cannot exist high up on the sides, due the rays being refracted upon entering though the aperture. A reflective surface may not be necessary here. FIG. 1 illustrates this, and the reflective material only covers the lower portion of the sides of the upper parabolic section.

FIGS. 2-7, and some of the other figures of the disclosure do not illustrate the reflector, as it would unnecessarily obscure other details. All of the embodiments of the present disclosure may have a separate reflector with or without a gap, or the outside of the lens may comprise a reflective surface. In an aspect, the reflective surface does not cover the aperture, of course.

FIGS. 5-7 illustrate some rays of radiant energy 8, also commonly referred to as vectors. These rays are illustrated as entering the concentrator/lens from a variety of angles. FIG. 5 shows rays entering at a direction perpendicular from its surface. As the viewer can see, the rays enter the lens/concentrator and then strike the receiver. Some of the rays are reflected when striking the internal edge of the lens, and all strike the receiver. Rays may be reflected either by total internal reflection if they strike the edge of the lens at an angle below the critical angle, or they may be reflected by a reflective surface 6 on or outside of the edge of the lens. In an aspect, many of the present embodiments comprise concentrators that are both refractive and reflective.

FIGS. 6 and 7 show rays at higher angles. Like FIG. 5, all of the rays strike the receiver. For an ideal embodiment comprising perfect transmissibility, reflectivity, and a perfect shape, all rays that enter the aperture of the lens strike the receiver for this ideal example.

FIGS. 2 and 3 illustrate an embodiment wherein the cross section of FIG. 1 has been revolved into a three-dimensional figure. FIG. 2 shows a top view, and FIG. 3 illustrates a perspective view. The receiver in this embodiment comprises a generally flat material with a half-circular shape. The receiver is struck from both sides. Without the lower concentrator, the receiver would need to be circular to fill the bottom of the top parabolic section 5 of the lens (at the waist 3). As the viewer can see, the addition of the lower concentrator 4 of the lens to a CPC reduces the size of the receiver needed to receive the radiant energy vectors in half, as a half-circle is half a circle.

FIGS. 1 and 8 illustrate highly reflective surfaces 10 that reflect rays of radiant energy 8 to the receiver 2. The reflective surface may be part of the lens' transmissible material 4 and 5. Its purpose is to reflect rays of radiant energy to the receiver. Rays of radiant energy that have entered an aperture of a lens 9 could exit the lens without striking the receiver if they strike the side of a lens at an angle greater than the critical angle. For many lens materials, this is only possible in the lower part of the lens. Thus, the reflective material does not need to completely cover the side of a lens, although it may. The reflective surfaces to the outside of the lenses in this figure show an embodiment in which there is a gap between the reflective surface and the lens, but the reflective surface may also be in contact with, or comprise the outside surface of a lens.

In an aspect, it is generally preferable for there to be no gap between the receivers and the concentrators/lens in many of the embodiments of this disclosure. This is due to possibility or rays of radiant energy internally reflecting off of the flat/planer edge of the lens/concentrator and not reaching the receiver.

In an aspect, rays of radiant energy may be partially absorbed by reflecting off of a reflective surface. Whereas rays traveling through a transparent medium, such as the concentrator/lens here, which are below the critical angle would reflect by total internal reflection if there is no reflective material in contact with the sides of the lens. It thus may be desirable to have a gap between the reflective material and the side of the lens. By this method and embodiment, rays below the critical angle will totally internally reflect, and rays above the critical angle will exit the lens, and then be reflected back into the lens by a reflective surface at a gap 10 from the lens, as seen in FIG. 8.

Materials

A preferable material for the lens/concentrator is glass, acrylic, or any transparent material in the working spectrum. If the collector is designed to work in the infrared spectrum, then Potassium Bromide (KBr), Germanium are preferred materials, as well as others. Potassium bromide has exceptional transmissibility in the infrared region. Both glass and potassium bromide have refractive indexes of approximately 1.5. (Due to dispersion, the refractive index varies with wavelength.) Using Snell's Law, the critical angle of infrared radiant energy entering or leaving from an insulative material, such as air, other transparent gases, and/or a partial vacuum, works out to be approximately 42 degrees from a line extended perpendicular to the surface of the lens for this index of refraction.

A list of other alternative materials for the lens/concentrator comprises: Acrylic, Acrylic Glass, or Plexiglass, Calcium Fluoride (CaF2), Fused Silica (FS), Germanium (Ge), Magnesium Fluoride (MgF2), N-BK7, Sapphire, Silicon (Si), Sodium Chloride (NaCl), Zinc Selenide (ZnSe), Zinc Sulfide (ZnS), or any material suitably transparent in the design spectral range. The index of refraction for these materials is generally between 1.4 and 4. Other material may also suffice, for example, semiconductors are generally transparent to infrared wavelengths and they may be utilized.

Real world materials do not exhibit perfect transmission, absorption, emittance, or reflectance. However, materials exist that exhibit very high or low values for these properties.

In many of the present embodiments, the receiver comprises a PV cell. The PV cell may be any common PV cell including traditional silicon cells, thin film, multijunction cells, perovskites, or other cells made from PV material. In an aspect, cells can be constructed of combinations of these cells, and combinations of the material of these cell types. For example, perovskites may be layered on top of silicon making a tandem multijunction cell.

In an aspect of the invention, the present concentrators reduce the amount of receiver and/or PV material needed to absorb a given amount of received radiation. In an aspect, multijunction cells are more expensive than single junction cells, and often the benefit in efficiency does not offset the greater cost. However, the cost benefit ratio may be favorably changed by the present embodiments that reduce the amount of material in these multijunction cells.

In an aspect, the receiver in these embodiments can be struck with radiant energy from a plurality of sides. Some PV materials may also be absorbent to radiation coming from a plurality of sides. In fact, bifacial PV panels that do this are currently on the market. However, if one material significantly blocks radiant energy from another, then it may be preferable to make a multijunction cell with the blocking material in the center and a more transparent material on either side. For example, and in an embodiment, a triple-junction cell could be constructed with silicon PV material in the center, and layers of perovskite-based PV material to the outside.

In as aspect, the transmissible material may be a fluid, such as water. The fluid may further comprise a heat transfer fluid that is heated by the receiver. The fluid may be moved through the concentrator and used to transfer heat.

An alternative embodiment comprises the receiver comprising PV, and the transmissible material comprising a heat transfer fluid. The embodiment can then generate electricity and heat. As an alternative, the heat transfer fluid can be for the use, or exclusive use of cooling the PV cells.

Compound Parabolic Concentrators

Compound parabolic concentrators are known devices. (They are sometimes also referred to as "compound parabolic collectors".) For this disclosure, they will often be referred to as CPCs, or CPC in the singular. CPCs are non-imaging radiant concentrators that have found common use in solar collectors. CPCs for solar use have reflective inner surfaces and concentrate solar radiant energy to a receiver. These concentrators take advantage of the directional distribution of sunlight, which is mostly in the direction of the sun. Diffuse sunlight generally comprises much less than half of the radiant energy from the sun on a clear day. The majority of radiant energy from the sun comes in one direction. However, when it is cloudy diffuse sunlight reaching the surface of the Earth may comprise a much higher percentage.

The concentration factor for 2D CPC's is given by the formula $C=1/\sin \emptyset$, where angle $\emptyset$ represents the acceptance half-angle. So, if an acceptance half-angle of 42 degrees is chosen, then $C=1.49$. This means that for radiant energy that enters within the acceptance half-angle range, the receiver is receiving about 50% more radiant energy than it would otherwise receive without the CPC. This is the ideal case assuming perfect reflectance. With real world materials, some radiant energy is absorbed by the reflective material inside the CPC, if present, and the concentration factor would be reduced.

In an embodiment, a CPC is filled with a transparent material, or solely comprises a transparent material. In an embodiment, the index of refraction of the transparent material is substantially different from an insulating material, or vacuum, or partial vacuum through which radiant energy comes towards the CPC-providing an index of refraction generally of 1.2 or higher than outside the CPC. (For the purposes of defining the invention, a substantially different index of refraction will be defined as greater than a 10% difference.) Provided glass is the transparent/transmissible material, radiant energy vectors within the CPC will be refracted upon being transmitted into the transmissible material of the concentrator and will not exceed approximately 42 degrees from a vector perpendicular to the top surface of the transparent material that fills the CPC and pointing towards the exit of the CPC, which occurs at the waist 3. In an aspect of common CPCs, the acceptance half-angle comprises the maximum angle of radiation rays entering the CPC from a vertical axis (normal) that reach the exit, as a common CPC has reflective inner sides and is not filled with a transmissible material with a significantly different index of refraction.

In many of the present embodiments, the CPC is filled with such a transmissible material. In this case, the acceptance half-angle of the CPC itself may be considered the maximum angle of radiation rays after they have entered the transmissible material and have been refracted into smaller angles. FIG. 7 illustrates an acceptance half-angle A1, which is in reference to an axis line 16, which is in this case the line of symmetry. In FIG. 7, A1 is the "outer" acceptance half-angle, and A2 is the "inner" acceptance half-angle. Thus, and for example, a CPC filled with glass may have an inner acceptance half-angle of 45 degrees yet concentrate incoming rays from an outer acceptance half-angle of 90 degrees. In this example, a full hemispherical view of rays is concentrated to the receiver, as the full acceptance angle is thus 180 degrees. For the purpose of defining the invention, the "outer" acceptance half-angle is the acceptance half-angle before the refraction of rays as they pass through the aperture, and the "inner" acceptance half-angle is the acceptance half-angle after they are refracted. (The acceptance angle is simply twice the acceptance half-angle.) In FIG. 7, A1 represents the outer acceptance half-angle, and A2 is the inner acceptance half-angle. As the viewer can see, A1 is greater than A2, as the transmissible material increases the acceptance angle (and half-angle) of the device 1.

FIG. 1 illustrates a two-dimensional cross-section of an embodiment comprising a CPC filled with, or comprising transparent material. For this two-dimensional ideal example, radiant energy may enter through the aperture 9 of the CPC. Provided the sides of the CPC comprise reflective material on the inside, all the radiant energy that enters the CPC will reach the bottom, provided this CPC has an inner acceptance half-angle greater than the critical angle of the transparent and transmissible material. (Note: this is for the ideal case which assumes perfect reflection within the CPC.) The exit of the CPC is the bottom of the upper parabolic concentrator 5, and is where it transitions to the lower concentrator 4 at the "waist" 3. For example, and in an embodiment, a CPC comprises an acceptance half-angle of 42 degrees. For this geometry, all vectors steeper than, or at 42 degrees will make it to the exit. This comprises all the vectors (that are not reflected off the top surface of the transmissible material or absorbed in imperfect reflection or by the material) that enter the top due to the CPC being filled with a transparent material with a higher refractive index than outside of the CPC. In this ideal example and embodiment of a concentrator, which comprises the CPC and it's exit, the radiant energy entering the aperture will reach the exit and then the receiver. In this example, the CPC will concentrate the radiant energy approximately by a factor of 1.5 (for this 2-D example) through the upper parabolic section of the lens.

In an aspect of the invention, radiation from a surface coming toward the concentrator comes from many directions. If a Blackbody is assumed, the directional distribution is even and radiant energy comes from every direction by the same amount. However, this is a bad assumption to make, as radiant sources generally radiate much less in directions at high angles to a vector perpendicular to the radiating surface. The distribution is generally not uniform in the real world. This is to the benefit of the present invention, as fewer radiant vectors compared to a blackbody need to be reflected to the receiver by a reflective surface.

In the embodiment above, the acceptance half-angle is greater than the critical angle. The critical angle is the angle at which a vector parallel to the top surface of the CPC would enter into the CPC due to the refraction the transmissible material provides. In an aspect of the invention, real world sources do not have the directional distribution of black bodies. In general, real world sources emit much less radiant energy at high angles to a vector perpendicular to and outward from the emitting surface than they emit at small angles. For this reason, it may be beneficial to design a CPC with a smaller acceptance half-angle and higher concentration factor. In an embodiment, the acceptance half-angle is smaller than the critical angle. In this embodiment, not all radiant energy vectors will reach the receiver. However, the gain in concentration factor may outweigh the loss in lost vectors.

In an aspect of some embodiments of the invention, it is known that reducing the height of a CPC will reduce its concentration factor. But, reducing the height may only reduce the concentration factor by a small amount, depending on the amount of truncation. The reason is that the upper sides of a CPC, which are parabolas, are very steep at the top, and contribute little to the concentration. In an embodiment, the CPC comprises a reduced height parabola. In an advantage, a reduced height parabola is likely easier to manufacture. Reducing height is sometimes referred to as truncation.

In an aspect of the invention, other shapes may be used. While some embodiments may be limited to CPCs, other embodiments may comprise non-parabolic shapes. For example, and in an embodiment, a concentrating collector may comprise sides with one or more straight lines in cross-section, or simple curves or arcs. In an aspect of the invention, CPCs comprise the concentrating collector(s), lens(es), or concentrator(s) of the invention. These can approximate a parabola in function.

In an aspect, the concentration ratio and particular dimensions and specifications listed in the given examples represent embodiments, however they were not given to limit the invention to those particular embodiments and those specific dimensions and specifications. The above examples were chosen to illustrate and disclose both the embodiments and the general theory of operation of the invention.

In an aspect of the invention, many of the present embodiments filled with a transmissible material enable these concentrators to concentrate radiant vectors/rays from all incoming angles. For solar concentrators, this has the advantage of not only concentrating the beam energy directly from the sun, but it also substantially collects and concentrates the diffuse/non-beam energy from the blue or cloudy sky. Here, the term "substantially" will refer to more than a quarter of the radiant energy from the surrounding sky. By contrast, tracking concentrators generally do not collect much diffuse sunlight. Many of the present inventions are exclusive from any tracking device, as they are not needed. However, the embodiments could be used with tracking devices.

Lower Concentrator

In many of the present embodiments, radiation that exits the upper parabolic sections/CPCs enter into the lower concentrators. The lower concentrator comprises at least one shape comprising at least one substantially circular, or arc shaped cross-section. Like the upper concentrator, other shapes may be substituted that approximate the function.

FIGS. 1-7 illustrate embodiments comprising a lower concentrator 4 with a half-circular cross-section. The receiver 2 in these example embodiments is inserted half way between the half-circular cross-section, or we could say between two quarter circles. The receiver is vertical, in respect to the drawing page, and in line with the Y axis.

FIGS. 8-17 illustrate other embodiments. In these embodiments, the lower section comprises a shape comprising of at least two substantially half-circular cross-sections. In these embodiments, the receiver sits in line with the X axis, and is horizontal to a vertical line of symmetry through the center of the concentrator. The receiver also is generally centered on a midpoint of a line between the two focal points of the parabolas that define the shape of the upper concentrator, and the receiver lies on the line.

Each of the semi-circular areas (arc shaped) that comprise the lower concentrator is defined by a radius whose center is at an end point of the receiver, and whose radius is equal to half of the length of the receiver. Similar to the upper concentrator, and as with the previous embodiments, the outer surface of the lower concentrator may be mirrored, or a/reflector may surround the outer surface if the collector shape consists of a transparent material with an index of refraction greater than air. With this shape, any rays of radiant energy that have passed through the top CPC portion of the collector, exiting the top section with a downward angle greater than zero (with respect to the X-axis), and do not strike the receiver's top surface, will be reflected off of the mirrored lower section of the collector and onto the bottom surface of the receiver to be absorbed.

If this shape is extruded into a linear trough, the concentration factor is the same as the previous embodiment. The receiver is only one half of the width of the receiver of a traditional CPC. Like the previous embodiment, the receiver can be struck from both sides, and is bifacial.

In an aspect, embodiments of the present invention are not limited to being symmetrical about a center axis. For example, a half CPC could be used.

In an aspect, the "lower concentrator" does not necessarily concentrate radiant flux. It generally delivers the flux concentrated by the upper concentrator to two sides of the receiver. Thus, it concentrates radiant energy onto a smaller amount of receiver material, as it directs radiant energy to two sides of the receiver, as opposed to a single side as would a common CPC. The lower concentrator in the above embodiments don't further concentrate the radiant flux, or energy absorbed per receiver surface area, but it does concentrate the flux onto a smaller volume of receiver material, as the flux is directed to two sides of the receiver (instead of one in a common CPC).

Three Dimensions and Arrays

Figure 11:
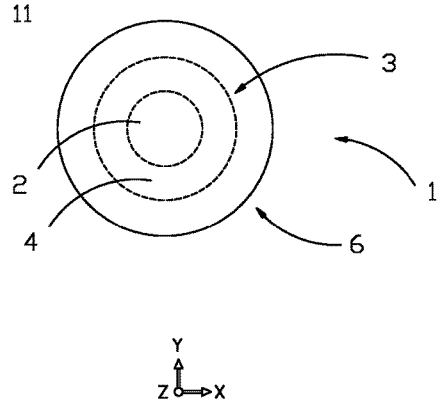
FIG. 11 illustrates a top view of a radiant concentrator in accordance with some embodiments.

In an aspect of the invention, the two-dimensional cross-sectional shapes shown FIGS. 1, 5-7, 8-9, and 13 may be turned into a variety of three-dimensional shapes. For example, and in embodiments, the two-dimensional shapes of FIGS. 1 and 8 may be revolved around the Y axis to form shapes with circular cross sections with respect to the X-Z plane, as illustrated in FIG. 3. In this case, the shape of the aperture 9 of the lens is a circle. FIG. 2 further illustrates a top view of FIG. 3, and FIG. 11 illustrates a top view of a revolved three-dimensional embodiment of FIGS. 8 and 9.

In an aspect of the invention, the lateral cross-sectional shapes are not limited to circles. In an example and embodiment, the cross-sectional shapes may comprise ovals. In this case, a concentrator of this embodiment has a different concentration factor from east to west than from north to south, respective to the embodiment placed on the ground and aligned with the greatest distance between quadrants lined up with the east west, or north south axis.

Figure 10:
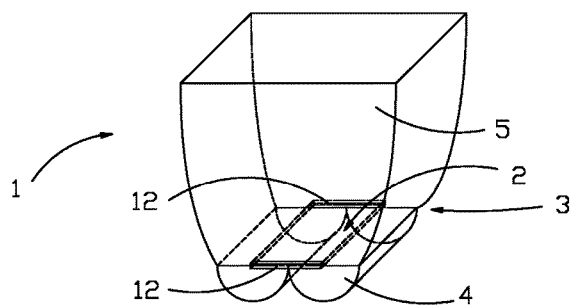
FIG. 10 illustrates a perspective view of a radiant concentrator in accordance with some embodiments.

In another example, and embodiments, the two-dimensional shape of FIG. 1 may be extruded linearly to form a trough, as illustrated in FIG. 4. Similarly, in another example, and embodiments, the two-dimensional shape of FIG. 8 may be extruded linearly to form a trough, as illustrated in FIG. 10. In these cases, the front and back may comprise flat sides and the upper concentrator only concentrates in one direction, or plane. But FIGS. 4 and 10 may also represent embodiments where the front and back are not flat. An example of these embodiments can be seen in FIG. 14 (front view) and FIG. 15 (side view). These illustrations show embodiments where the front and back, as viewed in FIG. 14, have a similar shape to the sides. FIG. 15 shows that the front and back, as seen in FIG. 14 also comprise a similar parabolic shape, as the front and back have the same cross-sectional shape as the sides. In this case, at least the upper parabolic concentrator concentrates in more than one direction/plane.

Further, the concentration factor for each direction may be different. In an example and embodiment, a three-dimensional collector can be constructed which is designed for placement with regard to a geographic direction, such as North. In this case, the overall concentration factor can be improved for collecting beam sunlight, as beam sunlight moves through a limited range of angles by having a greater concentration factor along one axis.

Further, the arrays of these concentrators can be assembled. In an aspect, an array of lenses with circular apertures may not be closest packed, as circles cannot be placed edge to edge without gaps.

In an aspect of the invention, three-dimensional shapes often have higher concentration ratios. For example, the revolved three-dimensional shape illustrated in FIG. 3 comprises a higher concentration ratio for a given acceptance half-angle. For example, if an acceptance half-angle of 45 degrees is selected, then the above listed formula for a two-dimensional CPC yields a concentration ratio of 1.414. This means that the receiver's length is 1/C or 0.707 of the length of the aperture of the CPC. The formula of the area of the circular exit of the upper CPC of FIG. 3 is given by the common formula $\pi r^2$. The concentration ratio of the 3-D shape is given by the area of the aperture divided by the area of the waist, so $C=\pi r^2/\pi(0.707*r)^2$, as the ratio between diameter and radius is the same. Values cancel, and C works out to a concentration value of 2, with an exit area that is just half of the area of the aperture. Thus, a three-dimensional revolved shape has the higher concentration value of 2 versus 1.414 for the two-dimensional example, or for a linear and/or extruded trough.

In an aspect, the lower concentrator in many of the present embodiments does not provide a concentration ratio per surface area of the receiver, as both sides of the receiver receive radiation energy. However, a smaller amount of material may be used, and thus there is a concentration per amount of material (—for the same thickness).

In an aspect and embodiment, the material of the receiver is a photovoltaic cell (PV). Provided a PV is used that is designed to be struck with radiant energy from both sides, the present embodiment enables a smaller PV cell to be utilized, saving costs of this relatively expensive material.

In an aspect of the invention, it is useful to turn a two-dimensional shape into a three-dimensional shape with an area that is a shape that can be closest packed together into an array or grid of concentrators. Closest packed shapes comprise triangles, squares, rectangles, trapezoids, and hexagons, etc. In an embodiment, the concentrating device comprises a panel and/or an array, or hex grid of concentrators, as illustrated in FIG. 17 (top view).

There exists two ways to closest pack these shapes. One method, and in an embodiment, the cross-sectional shape from edge to edge is the shape of the two-dimensional shape of FIGS. 1-4. A second method is where three-dimensional shapes may overlap. In an example and embodiment, revolved circular shapes may overlap to closest pack.

FIG. 17 illustrates a top view of a panel comprised of arrays of lenses, and receivers. The view is looking down on the apertures of the lenses. An array of lenses and receivers may be any array, such as a linear array, which FIG. 13 may represent, or a two-dimensional array, as illustrated in FIGS. 12, and 17. Preferably, the array is an array of lenses with aperture shapes that closest pack, such as triangles, rectangles, squares, or hexagons, but may be any shape.

FIG. 12 illustrates a bottom view of a two-dimensional array of the concentrators shown in FIGS. 14 and 15. A person skilled in the art can choose from different arrangements of placing the lens elements and suggested lens elements of this disclosure into some arrangement of array or packing that comprises a surface full of a plurality of lenses/concentrators and receivers without departing from the scope of the invention.

FIG. 13 illustrates a cross-section of the embodiment of FIG. 12. FIG. 14 illustrates a perspective view of one of the concentrators of FIG. 12. This is similar to the embodiment illustrated in FIG. 10. However, this embodiment is not simply a linear extrusion of the cross-section illustrated in FIG. 8. FIG. 15 illustrates a right-side view of the embodiment of FIG. 14. As the viewer can see, the top parabolic section concentrates in two-planes (3D). In this embodiment, the concentration factor of the top parabolic concentrator section concentrates by a factor of approximately two with a full hemispherical acceptance angle. The lower concentrator directs the concentrated radiant energy to two sides of the receiver. This enables a receiver that can be approximately one quarter of the size of the size of the receiver needed without this radiant concentrator embodiment. This is a significant reduction in the amount of receiver material.

The receivers of the present invention are bifacial. They generally receive substantial radiant energy from two sides. The radiant energy comes from a source whose energy passes through the aperture of the device. For the symmetrical embodiments of the invention, the concentrators direct an equal amount of radiant energy to each side of the receiver geometrically. However, due to variations in the direction of the source and uneven rays of input radiant energy, receivers may not experience equal radiant flux.

In an aspect, FIG. 13 illustrates that the concentrators of many of the present embodiments may be part of a sheet of transparent material 12—like glass. PV panels generally have a top cover comprising a transparent sheet 12, often glass. The lenses of the present concentrators can be molded, or otherwise manufactured into the top cover.

In an aspect, top covers and/or transparent sheets may comprise anti-reflective coatings, as is common. In another aspect, the reflective material and/or contacts of many of the present embodiments may comprise highly conductive material. This can be used to conduct heat energy away from the receiver. In an advantage, the lenses/concentrators of the present embodiments open up room for conductive paths below the apertures to conduct away heat.

FIG. 4 illustrates a concentrator that represents a cross-section extruded in the Z-direction making three-dimensional objects comprising a linear trough. (The Z-direction is out from the page.) A plurality of these concentrators may then comprise a one or two-dimensional array.

In an aspect and embodiment, arrays of the present concentrators may comprise a panel, or sheet. Panels can have any shape and are not limited to having a rectangular shape. Panels that comprise PV cells may be arraigned electrically in series or parallel, as is common. Panels may also mix concentrator (and non-concentrator) types.

Figure 9:
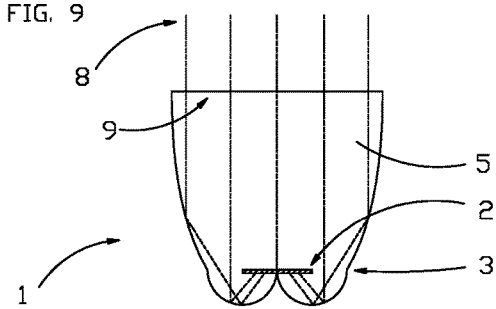
FIG. 9 illustrates a cross sectional view of a radiant concentrator in accordance with some embodiments.

FIG. 11 illustrates a top view of a cross-section of an embodiment that has the cross-section illustrated in FIG. 9. This is a revolved embodiment. In this example embodiment, the receiver comprises only one eighth of the area of the aperture, which would lead one to assume that it has a concentration factor of eight. However, some radiant rays (vectors) in this ideal example and embodiment will reflect back out of the concentrator, and the concentration value is not necessarily higher.

Uses

An exemplary use of the present concentrating collectors is to reduce the PV material for a PV cell and/or panel. This will generally result in a reduction of cost if the cost of the transparent and reflective materials added are less than the cost of extra PV materials required without a concentrator.

The smaller the amount of PV material in a PV panel, the less electrical contact material will be needed. The contact materials, such as silver, copper, or aluminum, are also an expensive part of a PV panel. Thus, the present embodiments can reduce these materials.

In an aspect, PV costs are currently below the cost of some fossil fuel based electrical generation. However, there is a transition point where PV costs plus the costs of storing electricity for when the sun is not providing power undercuts the cost of some fossil fuel generation. The reduction in costs provided by the present invention may provide the critical cost reduction to drop under the transition point.

In an aspect of PV cells, the cells require electrical contacts to route the free electrons into and out of the PV materials. In a traditional silicon-based PV cell, some of the contacts are on top of the PV cell. This shades some of the cell and reduces the efficiency. In an aspect of the present embodiments, the contacts can be out of the field of view in these concentrators. For example, the contacts can be at one or more ends of the receiver 2 of FIGS. 10, 14-15, and at the waist 3. FIG. 10 illustrates contacts 12 that are at the ends of the receiver, and outside of the concentrated radiant energy. They are in the shaded spaces, as illustrated in FIG. 13. Contacts, and other electrical connections, as well as heat dissipation elements can be in the shaded spaces 15. Also, the rectangular shape of the receiver in these figures may reduce waste in manufacture.

In an aspect, reflections often reduce efficiency through absorption. However, present embodiments can at least partially offset reflection losses through gains over traditional cells which have shading losses. The reflection losses can also be at least partially offset through the increase in solar cell efficiency that occurs with concentrated light.

The receivers of the present embodiments are generally not limited to PV cells, although some embodiments may be so limited. Other uses can comprise absorbers for absorbing radiant heat and turning it into heat energy that is conducted into another material.

In an aspect of the invention, any of the receivers can comprise receivers that absorb radiant energy and turn it into heat. In embodiments, the receiver may comprise selective surfaces that better retain heat by reducing infrared radiant emissions. In embodiments, any of the receivers may comprise shapes that are not flat. In an example, a receiver comprises a tube with a substantially circular cross section. The center of the cross-sectional shape is at the same position as the midpoint of the flat receivers illustrated. Two of the quadrants of the circular cross-sectional shape are at the positions of the endpoints of the flat receivers illustrated. FIGS. 18 and 19 illustrate examples of these embodiments.

In an aspect and embodiments, a linear array of radiant concentrators for absorbing radiant energy as heat comprise one pipe, or tube, that moves a heat transfer fluid through each of the concentrators. Provided the concentrators concentrate along the axis of the pipe, there is some of the pipe that is essentially shaded by the concentrators from the radiant energy source in the space between the concentrators 15. The outside surface of the pipe may be insulated, or may comprise a very low emittance surface, such as a polished reflective surface. In these embodiments, the total emittance of the pipe can be lowered, which in turn increases the net radiant heat gain by the receiver/pipe.

In an aspect, if glass is used as the transparent material of the concentrators, glass will conduct heat away from the pipe and emit infrared radiation. If a material, such as germanium is used, which has a significantly lower emittance than glass in the infrared spectrum, then the emittance of the concentrator will be lowered. In an embodiment, the transmissible material of the concentrators comprises a low emissive material.

As the viewer can see in FIG. 19, some of the outside surface of the pipe in these embodiments is not exposed to the radiation source. In this case, the lower surface may be a very low emittance surface to minimize infrared radiation losses, or insulated, which is an advantage to this design.

In an aspect, the present concentrators may be used in series. In embodiments, the present concentrators may receiver radiant energy from another concentrator. For example, a common lens 14, such as a Fresnel lens, may concentrate radiant energy and send it toward of the present concentrators, as illustrated in FIG. 20.

In another aspect, common parabolic mirrored concentrators are often used to focus solar beam energy to a receiver, which is often a tube carrying a fluid. The vast majority of radiant energy that strikes the tube is reflected off of the mirror. This incurs a reflection loss. However, this loss may still make a more efficient concentrator than using a common lens, such as a Fresnel lens, to concentrate radiation onto the tube. A problem with using a lens is that different frequencies are refracted at different rates-chromatic aberration. Due to this, the receiver tube has to be larger to receive all the refracted rays, as the focus for different frequencies differ.

In an embodiment, a common lens 14 focuses radiant energy on at least one of the concentrators of the present invention 1 that then concentrates these different frequencies to a smaller receiver than would otherwise be possible without the addition of the present concentrators. This arraignment of a plurality of concentrators may be part of a tracking collector. This plurality of concentrators can operate with fewer total reflections than a common parabolic mirror-based concentrator/collector. Thus, an advantage is that there are fewer losses due to reflection. Another advantage is that the present embodiment collects and concentrates some non-beam diffuse sunlight by design, if this embodiment is used as a solar collector.

In an aspect, the present concentrators may comprise a selective surface wherein the surface may absorb more radiant energy than it emits back at the source. If the receiver comprises PV material, it may simultaneously generate electrical energy and provide heat energy.

These examples are, of course, some of many uses, and the invention should not be limited to these example uses. Building The individual pieces and/or parts may be manufactured using common methods including, but not limited to, molding, machining, 3-D printing, or other methods. In the ideal examples disclosed within, some outer edges/walls of the transparent concentrators in an array approach each other and end up vertical to each other. Truncating the height can solve this manufacturing problem. Another solution is to manufacture in pieces and assemble.

Embodiments of the present invention can be assembled from parts. In an aspect, an array of concentrators can be assembled from individual concentrators or rows. In an aspect, the upper and lower concentrators can be made separately and assembled. In an aspect, theses concentrators can be made from pieces. As long as one piece of transmissible material contacts another without a significant gap between the two, radiant energy will pass between the two without significant reflections that would significantly lower the efficiency-much like one sheet of glass can be placed on another. It is within the ordinary skill in the art to manufacture the present concentrators from individual pieces and/or sub-assemblies and assemble.

SUMMARY, RAMIFICATIONS, AND SCOPE

The embodiments, methods, examples, and aspects of the embodiments and invention are disclosed herein to summarize the invention and are not intended to limit the scope of the invention.

The present disclosure generally relates to using a radiant concentrator comprising an upper concentrator and a lower concentrator portion to reduce the size of a receiver. The upper concentrator concentrates radiant energy into a smaller area with higher flux, and the lower portion concentrates radiant energy onto a smaller volume or piece of material than is possible without it.

The disclosed invention eliminates the problems associated with other methods of concentrating radiant energy, such as the need for tracking. Further, concentrators that require tracking generally do not collect diffuse radiant energy.

The disclosed invention also achieves a higher concentration ratio than common CPC's for a given view and acceptance angle. The disclosed invention also uses two sides of a receiver, which can save costs by using a smaller receiver.

The disclosure of the present invention as well as any references to preferred embodiments and other embodiments, are not for limiting the scope of the invention. Persons having ordinary skill in the art may make various modifications and changes without departing from the scope and spirit of the invention. Therefore, the scope of the appended claims should not be limited to the description of the embodiments described above. Accordingly, the scope should be determined not by the embodiments illustrated, but by the claims and their legal equivalents.

I claim:

1. A concentrator device for concentrating radiant energy onto a receiver; the device comprising a first concentrator, wherein the first concentrator comprises an aperture and a cross-section, wherein the cross-section comprises a plurality of walls that are substantially parabolic shaped, and wherein the first concentrator is filled to the aperture with a transmissible solid material with an index of refraction of 1.2 or higher for the use of increasing an acceptance angle of the first concentrator, wherein the radiant energy first enters the concentrator device through the aperture of the first concentrator, wherein the radiant energy flowing through the aperture is unconcentrated, wherein the receiver comprises a front side and a back side and is bifacial, wherein the receiver receives radiant energy concentrated by the first concentrator on both sides.

2. The concentrator device according to claim 1, wherein the concentrator device has an acceptance angle of 90 degrees or greater, wherein each side of the receiver comprises an area less than one third of an area of the aperture, wherein substantially all of the radiant energy that enters the concentrator lands on the bifacial receiver.

3. The concentrator device according to claim 1, wherein the concentrator device is exclusive of a tracking apparatus.

4. The concentrator device according to claim 1, wherein the first concentrator comprises a half-acceptance angle greater than 45 degrees, wherein a concentration factor of the first concentrator is greater than two.

5. The concentrator device according to claim 1, wherein a focus of one of the parabolic shaped walls lies on an opposing parabolic shaped wall.

6. The concentrator device according to claim 1, wherein the device further comprises a reflective material.

7. The concentrator device according to claim 6, wherein the device further comprises a gap between the reflective material and the transmissible material for the use of reducing reflective loss at the reflective material.

8. The concentrator device according to claim 1, wherein a panel comprises a glass cover, wherein the glass cover comprises an array of the concentrator devices according to claim 1.

9. The concentrator device according to claim 1, wherein the device comprises a second concentrator that directs the radiant energy to the plurality of sides.

10. The concentrator device according to claim 9, wherein the second concentrator comprises a cross-sectional shape that comprises a half circle.

11. The concentrator device according to claim 10, wherein a center point of the half circle is at the midpoint of a line drawn between two foci of the substantially parabolic shaped walls.

12. The concentrator device according to claim 10, wherein a center point of the half circle is at the midpoint of a line drawn between a focus of one of the substantially parabolic shaped walls and the midpoint of a line drawn between two foci of the walls.

13. The concentrator device according to claim 1, wherein the receiver comprises a photovoltaic cell.

14. The concentrator device according to claim 13, wherein one or more electrical contacts of the photovoltaic cell do not shade the cell from the concentrated radiant energy.

* * * * *